(12) United States Patent
Saha et al.

(10) Patent No.: US 8,255,780 B2
(45) Date of Patent: Aug. 28, 2012

(54) SCALABLE VLIW PROCESSOR FOR HIGH-SPEED VITERBI AND TRELLIS CODED MODULATION DECODING

(75) Inventors: Anindya Saha, Bangalore (IN); Hemant Mallapur, Bangalore (IN); Santhosh Billava, Kundapur Taluk (IN); Smitha Banavikal Math Veerabhadresh, Bangalore (IN)

(73) Assignee: Saankhya Labs Pvt Ltd., Bangalore (IN)

( * ) Notice: Subject to any disclaimer, the term of this patent is extended or adjusted under 35 U.S.C. 154(b) by 332 days.

(21) Appl. No.: 12/708,323

(22) Filed: Feb. 18, 2010

(65) Prior Publication Data

US 2010/0211858 A1 Aug. 19, 2010

(30) Foreign Application Priority Data

Feb. 18, 2009 (IN) .............................. 346/CHE/2009

(51) Int. Cl.
*H03M 13/03* (2006.01)
(52) U.S. Cl. ........ 714/792; 714/786; 714/800; 714/752; 714/796; 714/795; 714/797; 714/789; 714/799
(58) Field of Classification Search ........................ None
See application file for complete search history.

(56) References Cited

U.S. PATENT DOCUMENTS

| | | | | |
|---|---|---|---|---|
| 5,933,462 A * | 8/1999 | Viterbi et al. | ................. | 375/341 |
| 7,603,613 B2 * | 10/2009 | Pisek et al. | ..................... | 714/795 |
| 7,716,564 B2 * | 5/2010 | Yen et al. | ...................... | 714/794 |
| 7,908,542 B2 * | 3/2011 | Solomon et al. | ............. | 714/774 |
| 7,925,964 B2 * | 4/2011 | Efimov et al. | ................. | 714/795 |
| 2002/0056068 A1 * | 5/2002 | Aymar et al. | ................. | 714/795 |
| 2007/0006058 A1 * | 1/2007 | Varanasi | ....................... | 714/795 |
| 2009/0063939 A1 * | 3/2009 | Yen | ................. | 714/792 |
| 2009/0063940 A1 * | 3/2009 | Yen et al. | ...................... | 714/792 |
| 2009/0168926 A1 * | 7/2009 | Venkatachalam et al. | .... | 375/341 |
| 2010/0150280 A1 * | 6/2010 | Gutcher et al. | ............... | 375/341 |
| 2011/0161787 A1 * | 6/2011 | Hekstra et al. | ................ | 714/795 |

* cited by examiner

*Primary Examiner* — John Trimmings
(74) *Attorney, Agent, or Firm* — Rahman LLC

(57) ABSTRACT

An application specific processor to implement a Viterbi decode algorithm for channel decoding functions of received symbols. The Viterbi decode algorithm is at least one of a Bit Serial decode algorithm, and block based decode algorithm. The application specific processor includes a Load-Store, Logical and De-puncturing (LLD) slot that performs a Load-Store function, a Logical function, a De-puncturing function, and a Trace-back Address generation function, a Branch Metric Compute (BMU) slot that performs Radix-2 branch metric computations, Radix-4 branch metric computations, and Squared Euclidean Branch Metric computations, and an Add-Compare-Select (ACS) slot that performs Radix-2 Path metric computations, Radix-4 Path metric computations, best state computations, and a decision bit generation. The LLD slot, the BMU slot and the ACS slot perform in a software pipelined manner to enable high speed Viterbi decoding functions.

7 Claims, 15 Drawing Sheets

| GPR BANK 112D | | | |
|---|---|---|---|
| PORT TYPE | LLD-UNIT | BM-UNIT | ACS-UNIT |
| READ | 4 | 1 | 0 |
| WRITE | 2 | 1 | 2 |
| DP BANK 112A | | | |
| PORT TYPE | LLD-UNIT | BM-UNIT | ACS-UNIT |
| READ | 2 | 1 | 0 |
| WRITE | 4 | 1 | 0 |
| BMS & BMP BANK 112B | | | |
| PORT TYPE | LLD-UNIT | BM-UNIT | ACS-UNIT |
| READ | 0 | 2 | 4 |
| WRITE | 0 | 2 | 4 |
| SMS & SMP BANK 112C | | | |
| PORT TYPE | LLD-UNIT | BM-UNIT | ACS-UNIT |
| READ | 2 | 2 | 4 |
| WRITE | 2 | 2 | 4 |

| MODE 302 | RESULT 304 |
|---|---|
| DEPUN RX_O:RX_E (CODE RATE = 7/8) | X: 1 0 0 0 1 0 1  (S1  ZERO  ZERO  ZERO  S6  ZERO  S8)<br>Y: 1 1 1 1 1 0 1 0 (S2  S3  S4  S5  ZERO  S7  ZERO)<br>DP0 = [S5 ZERO S4 ZERO S3 ZERO S2 S1]<br>DP1 = [S2 S1 ZERO S8 S7 ZERO ZERO S6]<br>DP2 = [ZERO S6 S5 ZERO S4 ZERO S3 ZERO]<br>DP3 = [ZERO S8 S7 ZERO] (UPPER BITS ARE ZERO FILLED) |
| DEPUN RX_O:RX_E (CODE RATE = 5/6) | X: 1 0 1 0 1  (S1  ZERO  S4  ZERO  S6)<br>Y: 1 1 0 1 0 (S2  S3  ZERO  S5  ZERO)<br>DP0 = [S5 ZERO ZERO S4 S3 ZERO S2 S1]<br>DP1 = [ZERO S4 S3 ZERO S2 S1 ZERO S6]<br>DP2 = [ZERO S6 S5 ZERO] (UPPER BITS ARE ZERO FILLED) |
| DEPUN RX_O:RX_E (CODE RATE = 3/4) | X: 1 0 1  (S1  ZERO  S4 )<br>Y: 1 1 0 (S2  S3  ZERO)<br>DP0 = [S2 S1 ZERO S4 S3 ZERO S2 S1]<br>DP1 = [S3 ZERO S2 S1 ZERO S4 S3 ZERO]<br>DP2 = [ZERO S4 S3 ZERO S2 S1 ZERO S4] |
| DEPUN RX_O:RX_E (CODE RATE = 2/3) | X: 1 0 (S1  ZERO)<br>Y: 1 1 (S2  S3)<br>DP0 = [S3 ZERO S2 S1 S3 ZERO S2 S1]<br>DP1 = [S3 ZERO S2 S1 S3 ZERO S2 S1]<br>DP2 = [S3 ZERO S2 S1] (UPPER BITS ARE ZERO-FILLED) |

| ADDER SOURCES | R2BML | R2BMH | R4BM | ER2BM #TRELLIS_ SYMBOL_INDEX |
|---|---|---|---|---|
| M0_SRC1 | OPF_READ_PORT0_I(3:0) & DEPUN_MASKLL | OPF_READ_PORT0_I(19:16) & DEPUN_MASKLL | OPF_READ_PORT0_I( 3:0) | ZEROS |
| M0_SRC2 | OPF_READ_PORT0_I(7:4) & DEPUN_MASKLH | OPF_READ_PORT0_I(23:20) & DEPUN_MASKLH | OPF_READ_PORT1_I( 4:0) | ZEROS |
| M1_SRC1 | OPF_READ_PORT0_I(3:0) & DEPUN_MASKLL | OPF_READ_PORT0_I(19:16) & DEPUN_MASKLL | OPF_READ_PORT0_I( 4:0) | ZEROS |
| M1_SRC2 | OPF_READ_PORT0_I(7:4) & DEPUN_MASKLH | OPF_READ_PORT0_I(23:20) & DEPUN_MASKLH | OPF_READ_PORT1_I( 12:8) | ZEROS |
| M2_SRC1 | OPF_READ_PORT0_I(3:0) & DEPUN_MASKLL | OPF_READ_PORT0_I(19:16) & DEPUN_MASKLL | OPF_READ_PORT0_I( 4:0) | ZEROS |
| M2_SRC2 | OPF_READ_PORT0_I(7:4) & DEPUN_MASKLH | OPF_READ_PORT0_I(23:20) & DEPUN_MASKLH | OPF_READ_PORT1_I( 20:16) | ZEROS |
| M3_SRC1 | OPF_READ_PORT0_I(3:0) & DEPUN_MASKLL | OPF_READ_PORT0_I(19:16) & DEPUN_MASKLL | OPF_READ_PORT0_I( 4:0) | ZEROS |
| M3_SRC2 | OPF_READ_PORT0_I(7:4) & DEPUN_MASKLH | OPF_READ_PORT0_I(23:20) & DEPUN_MASKLH | OPF_READ_PORT1_I( 28:24) | ZEROS |

| ADDER SOURCES | R2BML | R2BMH | R4BM | ER2BM #TRELLIS_SYMBOL_INDEX |
|---|---|---|---|---|
| M4_SRC1 | OPF_READ_PORT0_I(11:8) & DEPUN_MASKHL | OPF_READ_PORT0_I(27:24) & DEPUN_MASKHL | OPF_READ_PORT0_I(12:8) | ZEROS |
| M4_SRC2 | OPF_READ_PORT0_I(15:12) & DEPUN_MASKHL | OPF_READ_PORT0_I(31:28) & DEPUN_MASKHH | OPF_READ_PORT1_I(4:0) | ZEROS |
| M5_SRC1 | OPF_READ_PORT0_I(11:8) & DEPUN_MASKHL | OPF_READ_PORT0_I(27:24) & DEPUN_MASKHL | OPF_READ_PORT0_I(12:8) | ZEROS |
| M5_SRC2 | OPF_READ_PORT0_I(15:12) & DEPUN_MASKHL | OPF_READ_PORT0_I(31:28) & DEPUN_MASKHH | OPF_READ_PORT0_I(12:8) | ZEROS |
| M6_SRC1 | OPF_READ_PORT0_I(11:8) & DEPUN_MASKHL | OPF_READ_PORT0_I(27:24) & DEPUN_MASKHL | OPF_READ_PORT0_I(12:8) | ZEROS |
| M6_SRC2 | OPF_READ_PORT0_I(15:12) & DEPUN_MASKHL | OPF_READ_PORT0_I(31:28) & DEPUN_MASKHH | OPF_READ_PORT1_I(20:16) | ZEROS |
| M7_SRC1 | OPF_READ_PORT0_I(11:8) & DEPUN_MASKHL | OPF_READ_PORT0_I(27:24) & DEPUN_MASKHL | OPF_READ_PORT0_I(12:8) | ZEROS |
| M7_SRC2 | OPF_READ_PORT0_I(15:12) & DEPUN_MASKHL | OPF_READ_PORT0_I(31:28) & DEPUN_MASKHH | OPF_READ_PORT1_I(28:24) | ZEROS |

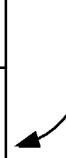

FIG. 6B

| ADDER SOURCES | R2BML | R2BMH | R4BM | ER2BM #TRELLIS_SYMBOL_INDEX (K RANGES FROM 0 TO 7) |
|---|---|---|---|---|
| M8_SRC1 | ZEROS | ZEROS | OPF_READ_PORT0_I(20:16) | {8{OPF_READ_PORT0_I[4K+3:4K]}} |
| M8_SRC2 | ZEROS | ZEROS | OPF_READ_PORT1_I(4:0) | 1ST REFERENCE SYMBOL OF TRELLIS |
| M9_SRC1 | ZEROS | ZEROS | OPF_READ_PORT0_I(20:16) | {8{OPF_READ_PORT0_I[4K+3:4K]}} |
| M9_SRC2 | ZEROS | ZEROS | OPF_READ_PORT1_I(12:8) | 2ND REFERENCE SYMBOL OF TRELLIS |
| M10_SRC1 | ZEROS | ZEROS | OPF_READ_PORT0_I(20:16) | {8{OPF_READ_PORT0_I[4K+3:4K]}} |
| M10_SRC2 | ZEROS | ZEROS | OPF_READ_PORT1_I(20:16) | 3RD REFERENCE SYMBOL OF TRELLIS |
| M11_SRC1 | ZEROS | ZEROS | OPF_READ_PORT0_I(20:16) | {8{OPF_READ_PORT0_I[4K+3:4K]}} |
| M11_SRC2 | ZEROS | ZEROS | OPF_READ_PORT1_I(28:24) | 4TH REFERENCE SYMBOL OF TRELLIS |

| ADDER SOURCES | R2BML | R2BMH | R4BM | ER2BM #TRELLIS_SYMBOL_INDEX WHERE K RANGES FROM 0 TO 7 |
|---|---|---|---|---|
| M12_SRC1 | ZEROS | ZEROS | OPF_READ_PORT1_I(28:24) | {8{OPF_READ_PORT0_I[4K+3:4K]}} |
| M12_SRC2 | ZEROS | ZEROS | OPF_READ_PORT0_I(4:0) | 5$^{TH}$ REFERENCE SYMBOL OF TRELLIS |
| M13_SRC1 | ZEROS | ZEROS | OPF_READ_PORT1_I(28:24) | {8{OPF_READ_PORT0_I[4K+3:4K]}} |
| M13_SRC2 | ZEROS | ZEROS | OPF_READ_PORT0_I(12:8) | 6$^{TH}$ REFERENCE SYMBOL OF TRELLIS |
| M14_SRC1 | ZEROS | ZEROS | OPF_READ_PORT1_I(28:24) | {8{OPF_READ_PORT0_I[4K+3:4K]}} |
| M14_SRC2 | ZEROS | ZEROS | OPF_READ_PORT0_I(20:16) | 7$^{TH}$ REFERENCE SYMBOL OF TRELLIS |
| M15_SRC1 | ZEROS | ZEROS | OPF_READ_PORT1_I(28:24) | {8{OPF_READ_PORT0_I[4K+3:4K]}} |
| M15_SRC2 | ZEROS | ZEROS | OPF_READ_PORT0_I(28:24) | 8$^{TH}$ REFERENCE SYMBOL OF TRELLIS |

| ACS STATE METRIC INPUT | ACS UNIT MODES | |
|---|---|---|
| | FORWARD TRELLIS | REVERSE TRELLIS |
| SM0_SRC1 | SM_PORT1[0] | SM_PORT1[0] |
| SM0_SRC2 | SM_PORT2[0] | SM_PORT1[1] |
| SM0_SRC3 | SM_PORT3[0] | SM_PORT1[2] |
| SM0_SRC4 | SM_PORT4[0] | SM_PORT1[3] |
| SM1_SRC1 | SM_PORT1[1] | SM_PORT2[0] |
| SM1_SRC2 | SM_PORT2[1] | SM_PORT2[1] |
| SM1_SRC3 | SM_PORT3[1] | SM_PORT2[2] |
| SM1_SRC4 | SM_PORT4[1] | SM_PORT2[3] |
| SM2_SRC1 | SM_PORT1[2] | SM_PORT3[0] |
| SM2_SRC2 | SM_PORT2[2] | SM_PORT3[1] |
| SM2_SRC3 | SM_PORT3[2] | SM_PORT3[2] |
| SM2_SRC4 | SM_PORT4[2] | SM_PORT3[3] |
| SM3_SRC1 | SM_PORT1[3] | SM_PORT4[0] |
| SM3_SRC2 | SM_PORT2[3] | SM_PORT4[1] |
| SM3_SRC3 | SM_PORT3[3] | SM_PORT4[2] |
| SM3_SRC4 | SM_PORT4[3] | SM_PORT4[3] |

FIG. 8A

SCALABLE VLIW PROCESSOR FOR HIGH-SPEED VITERBI AND TRELLIS CODED MODULATION DECODING

BACKGROUND

1. Technical Field

The embodiments herein generally relate to Viterbi decoders, and, more particularly, to techniques for improving the performance and speed of Viterbi and Trellis Coded Modulation (TCM) Decoding for Multi-Standard support.

2. Description of the Related Art

Typical DTV demodulation schemes require either a Viterbi decoder or a Trellis Coded Modulated (TCM) decoder for implementing channel decoding functionality. Viterbi decoding and Trellis Coded Modulation (TCM) decoding can be done by implementing Viterbi decode algorithm. The Viterbi decode algorithm may use either bit serial method or block based method for decoding. The bit serial method has a limitation in which for decoding each bit, the trellis trace-back requirement is 5*K (K is constraint length of the convolution code) without puncturing.

The number of cycles for decoding each bit directly depends on the constraint length K. In addition, the computation and the number of cycles required is extremely high to support the required data rate. As compared to the bit serial method, the block based method (e.g., particularly Sliding Block Decoding algorithm) allows for a high degree of concurrent processing of independent blocks (e.g., of input channel symbols) if the operations are pipelined. The number of bits decoded is higher (e.g., a block of 2*L bits are decoded for every 4*L channel symbols, where L is a maximum of 5*K without depuncturing) than the bit serial method and increases the throughput.

The Viterbi decoding requires Branch Metric computation (BM), Path Metric (or State Metric—SM) computation and Trace-back and decode bit generation. The BM or SM values can be computed using either radix-2 or radix-4 architecture. In radix-4 architecture, there is a four-fold increase in the throughput because the number of trellis iterations covered, the number of states per iteration covered and the decoding rate is twice in radix-4 compared to radix-2. The radix-4 structure is used to meet the required data rate, since it offers the best gains in decoding rate, even though the hardware requirement of radix-4 architecture is comparatively more than the radix-2.

For a radix-4 architecture, the computation requirement of DVB-T Viterbi decoding is number of BM computations is 210, the number of SM computations is 1120 and the number of trace-back computations is 280 for L=35. But, with the total number of cycles available to decode 2 L bits being 12 L cycles, approximately 24 operations are required to be completed in 6 cycles to sustain the maximum data rate. This high compute requirement can be achieved only with multiple execution units or a CPU, which can run at higher speeds. However, due to the sequential mode of data flow even higher speeds are insufficient to get higher decoding rates.

The best CPU utilization can be achieved only when all the operations of Branch Metric Computation, Path Metric Computation and Trace-back are segregated on three different execution units and their relative operations are pipelined. The conventional DTV channel decoding schemes is not scalable and not flexible to implement Viterbi decoding and Trellis Coded Modulated (TCM) decoding and does not support a multitude of code rates, different encoding polynomials, puncturing patterns while at the same time supporting high data rates.

SUMMARY

In view of the foregoing, an embodiment herein provides an application specific processor to implement a Viterbi decode algorithm for channel decoding functions of received symbols based on instructions received as a fetch packets. The Viterbi decode algorithm is at least one of a Bit Serial decode algorithm, and block based decode algorithm. The application specific processor includes a Load-Store, Logical and De-puncturing (LLD) slot that performs at least one of a Load-Store function, a Logical function, a De-puncturing function, and a trace-back function to generate decode bits, a Branch Metric Compute (BMU) slot that performs at least one of a Radix-2 branch metric computations, a Radix-4 branch metric computations, and Squared Euclidean Branch Metric computations, and an Add-Compare-Select (ACS) slot that performs at least one of a Radix-2 Path metric computations, a Radix-4 Path metric computations, a best state computations, and a decision bit generation. The LLD slot, the BMU slot and the ACS slot perform in a software pipelined manner to enable high speed Viterbi decoding functions.

At least one of a specialized register file components includes an optimized number of at least one of read ports and write ports that enables a faster processing of the Viterbi decoding functions. The specialized register file includes at least one of a De-puncturing Register File, a General Purpose Register file, Primary and Secondary State Metric Register files, and Primary and Secondary Branch Metric Register files.

In another embodiment, a method of performing a high speed Viterbi and Trellis Coded Modulated (TCM) decoding for a Multi-Standard support in an application specific processor is provided. The application specific processor includes a Load-Store, Logical and De-puncturing (LLD) slot that performs at least one of a Load-Store function, a Logical function, a De-puncturing function, and a trace-back function to generate decode bits, a Branch Metric Compute (BMU) slot that performs at least one of a Radix-2 branch metric computations, a Radix-4 branch metric computations, and Squared Euclidean Branch Metric computations, an Add-Compare-Select (ACS) slot that performs at least one of a Radix-2 Path metric computations, a Radix-4 Path metric computations, a best state computations, and a decision bit generation, and a specialized register file components including an optimized number of at least one of read ports and write ports that enables a faster processing of the Viterbi decoding functions. The specialized register file includes at least one of a De-puncturing Register File, a General Purpose Register file, Primary and Secondary State Metric Register files, and Primary and Secondary Branch Metric Register files.

The method includes loading channel symbols in an input buffer based on instructions received as a fetch packet, de-puncturing the channel symbols based on a puncturing code rate, the puncturing code rate is at least one of a ½, ⅔, ¾, ⅚, and ⅞ rates convolution codes, storing de-punctured channel symbols in the De-puncturing Register File, and extracting bits from the De-puncturing Register File to the General Purpose Register File.

At least one of Radix-2, a Radix-4 branch metric values and Squared Euclidean branch metric values computed for the de-punctured channel symbols in the BMU slot. At least one of a Quad Radix-4 and Dual Radix-4 add-compare-select values are computed in the ACS slot. The ACS slot is a 4 way Single Instruction Multiple Data (SIMD) slot. Decision bits are generated based on the add-compare-select values and storing the decision bits in a trace back buffer. The de-puncturing the channel symbols is enabled using DEPUN instructions.

In yet another embodiment, a method of generating a Traceback address of high speed Viterbi and Trellis Coded Modulated (TCM) decoding for a Multi-Standard support in a Traceback buffer is provided. The method is being implemented in an application specific processor that includes a Load-Store, Logical and De-puncturing (LLD) slot to perform at least one of a Load-Store function, a Logical function, a De-puncturing function, and a trace-back function, a Branch Metric Compute (BMU) slot that performs at least one of a Radix-2 branch metric computations, a Radix-4 branch metric computations, and Squared Euclidean Branch Metric computations, and an Add-Compare-Select (ACS) slot that performs at least one of a Radix-2 Path metric computations, a Radix-4 Path metric computations, a best state computations, and a decision bit generation.

The method includes loading a base pointer with an Init-Traceback pointer, obtaining a best state index based on the best state metric computations from the ACS slot using a general purpose register, selecting an appropriate bit from the best state index based on a threshold indicator bit index. The threshold indicator bit index is stored in a CPU control register (CCR). A next InitTraceback pointer is obtained by multiplying a constant value constant scaling factor to a value of the appropriate bit being indexed from the best state index using the threshold indicator bit index and adding a base address. A post-increment offset indexing or a post-decrement offset indexing is performed in the Traceback buffer. N decision bits are extracted based on state metric computations. The N decision bits are extracted using a decision vector loaded from a location by the InitTraceback pointer. The N decision bits are appended to derive a Next Best State Index. The N decision bits are appended on a most significant side of the best state index to derive the Next Best State Index for the Traceback in forward Trellis. The N decision bits are appended on a least significant side of the best state index to derive the Next Best State Index for the Traceback in reverse Trellis. N bits of the Best State Index are shifted. The N bits are shifted from a least significant side of the Best State Index for the Traceback in forward Trellis. The N bits are shifted from a most significant side of the Best State Index for the Traceback in reverse Trellis. Decoded bits are obtained by concatenating the shifted N bits.

The method further includes loading a base pointer with the next InitTraceback pointer that is obtained, obtaining a best state index based on a result from the next best state index. If the Traceback buffer is not fully traversed and the decoded bits are not extracted, then the method further includes selecting an appropriate bit from the best state index based on a threshold indicator bit index. The threshold indicator bit index is stored in a CPU control register (CCR). A next InitTraceback pointer is obtained by multiplying a constant value constant scaling factor to a value of the appropriate bit that is indexed from the best state index using the threshold indicator bit index and adding a base address. A post-increment offset indexing or a post-decrement offset indexing is performed in the Traceback buffer. N decision bits are extracted based on state metric computations. The N decision bits are extracted using a decision vector loaded from a location by the InitTraceback pointer. The N decision bits are appended to derive a Next Best State Index. The N decision bits are appended on a most significant side of the best state index to derive the Next Best State Index for the Traceback in forward Trellis. The N decision bits are appended on a least significant side of the best state index to derive the Next Best State Index for the Traceback in reverse Trellis. N bits of the Best State Index are shifted. The N bits are shifted from a least significant side of the Best State Index for the Traceback in forward Trellis. The N bits are shifted from a most significant side of the Best State Index for the Traceback in reverse Trellis. Decoded bits are obtained by concatenating the shifted N bits.

BRIEF DESCRIPTION OF THE DRAWINGS

The embodiments herein will be better understood from the following detailed description with reference to the drawings, in which:

FIG. 2 illustrates a table showing the number of registers required for read and write ports for different register files of FIG. 1 according to an embodiment herein;

FIG. 3 illustrates a table showing results for different de-puncturing modes in the De-puncturing function of the LLD slot of FIG. 1 according to an embodiment herein;

FIG. 6A through 6D illustrate a table for a branch metric input selection for Radix-2, Radix-4 and squared Euclidean computation according to an embodiment herein;

FIG. 8A illustrates a table for selection of SM sources for the different ACS modes according to an embodiment herein;

DETAILED DESCRIPTION OF EMBODIMENTS

Figure 1:
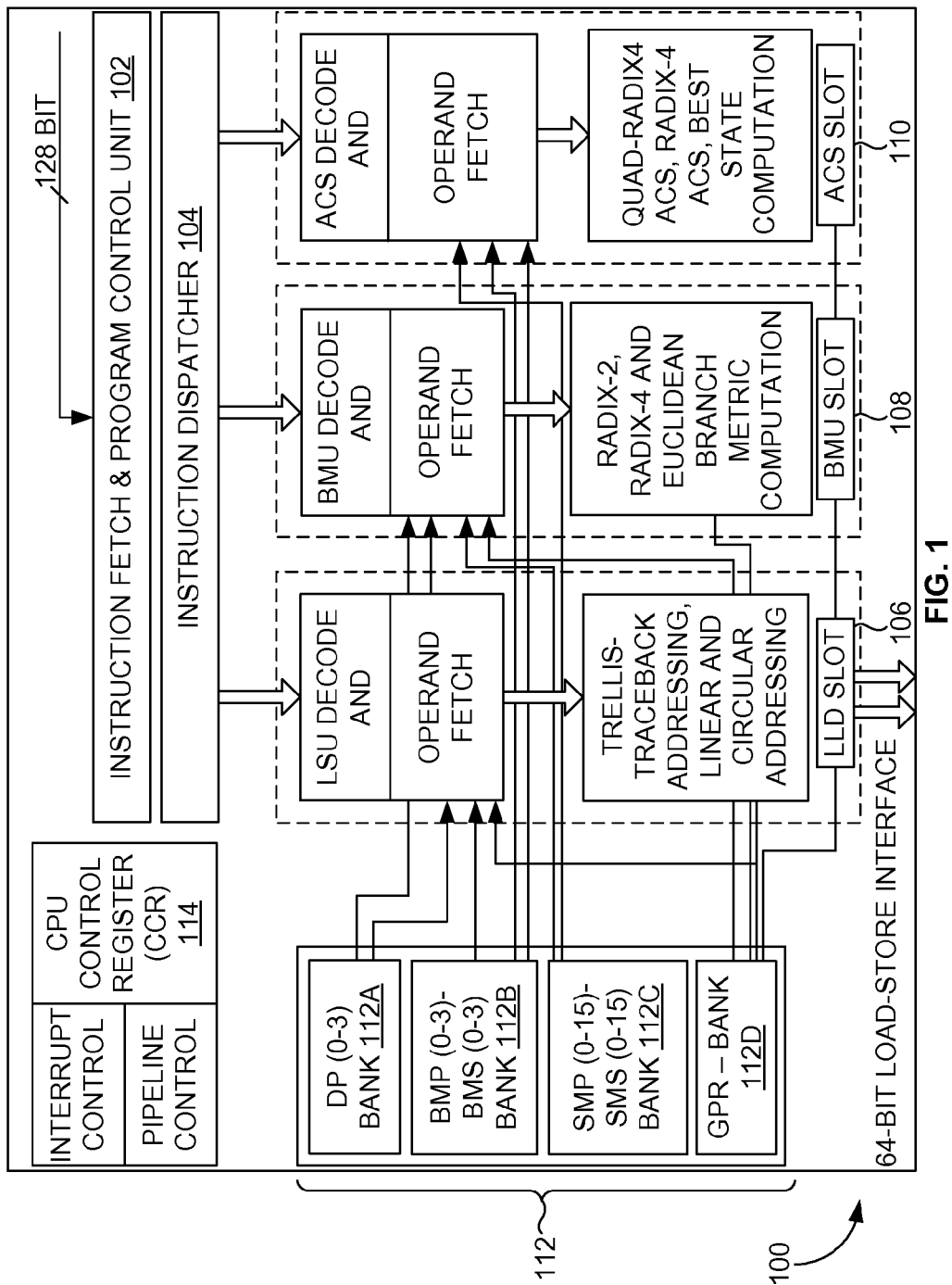
FIG. 1 illustrates a block diagram of a Viterbi CPU according to an embodiment herein.

The embodiments herein and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein achieve this using a most optimum partitioning of execution slots to keep the utilization of each of the different functions balanced to ensure a high speed Viterbi decoding in a software pipelined manner. An application specific processor is designed to implement a Viterbi algorithm for maximum likelihood decoding of convolution codes and Trellis codes. Data transfer between an outer decoder (e.g., Reed Solomon) and a Viterbi decoder happens in terms of data blocks. Viterbi decode algorithms may be a bit serial algorithm or block based algorithm. The computation and number of cycles required for the bit serial algorithm is extremely high. The Viterbi CPU is optimum to perform block based decoding techniques as compared to the bit serial techniques. The sliding block decoding algorithms allow for a high degree of concurrent processing of independent blocks (e.g., of input channel symbols), if the operations are pipelined.

Referring now to the drawings, and more particularly to FIGS. 1 through 10, where similar reference characters denote corresponding features consistently throughout the figures, there are shown embodiments of the invention.

FIG. 1 illustrates a block diagram of a viterbi CPU 100 according to an embodiment herein. The VLIW core for Viterbi decoding is a 32-bit, 3-way VLIW processor with minimal control functions. The VLIW processor includes two separate memory ports, one for a data memory and other for a program memory. The program memory uses a 32-bit address and a 128 bit data bus. The data memory uses a 32-bit address and a 64-bit data bus. The program memory block and the data memory block are external interfaces to the VLIW CPU 100.

The Viterbi CPU 100 includes a instruction fetch and program control unit 102, a instruction dispatcher 104, three VLIW execution slots viz., a Load-Store, Logical and De-puncturing (LLD) slot 106, a Branch Metric Compute (BMU) slot 108 and an Add-Compare-Select (ACS) slot 110, a register file 112 and control register file 114. The processor uses fixed length instructions of 32 bit each. The instructions are fetched as one fetch packet including 4×32 bit words. Each of the instructions may include a p-bit to control at least one of a parallel and a serial execution of instructions. The instructions being executed in parallel constitute an execute packet.

An execute packet may include up to three instructions. Each instruction in the execute packet may use a different functional unit. The execute packet may cross fetch packet boundaries, but limited to not more than three instructions in one execute packet. The last instruction in the execute packet will be marked with its p-bit cleared to zero. The instruction fetch and program control unit 102 may support for executing software-pipelined loops in an efficient manner. The instruction dispatcher 104 reads instructions from an instruction buffer. The instruction dispatcher 104 dispatches the instructions to appropriate execution slots (e.g., the LLD slot 106, the BMU slot 108 and the ACS slot 110) based on an ID of the execution slot specified in the opcode.

If the execution packet contains less than three instructions, the instruction dispatcher 104 inserts NOP (No-operation) in other positions and dispatches to the execution slots. The register file 112 of the Viterbi CPU 100 includes specialized register file components to enable faster processing of Viterbi decoding functions. The specialized register file components include specialized de-puncturing register file (DP bank) 112A, primary and secondary branch metric registers files (BMP and BMS) 112B, primary and secondary state metric register files (SMP and SMS bank) 112C and a general purpose register file (GPR bank) 112D.

The specialized de-puncturing register file (DP bank) 112A acts as an expander to accommodate an expansion of channel symbols and includes 4-32 bit registers viz., DP0, DP1, DP2 and DP3. The primary and secondary branch metric registers files (BMP and BMS) 112B are organized as 2×16-32 bit registers. The primary and secondary branch metric registers files 112B may store computed branch metrics, used during both the forward and the reverse ACS slot 110 processing.

The primary and secondary state metric register files (SMP and SMS Bank) 112C, are organized as 2×16-32 bit registers. The primary and secondary state metric register files 112C may enable a high throughput forward and reverse ACS slot 110 processing and are optimized to store intermediate results of Radix-2 or Radix-4 based state metrics. In one embodiment, the architecture of the Viterbi CPU 100 also supports a shadow state metric register (SMQ) file of the same capacity to maintain the state metrics between the forward and the reverse Trellis iteration process. This enables higher throughput since it saves large number of cycles which can get wasted for storing and retrieving the state metrics before best state metric computation.

The general purpose register file (e.g., GPR bank) 112D includes 16 GPR registers. The specialized register file components of the register file 112 may have an optimized connectivity to the various execution slots (e.g., the LLD slot 106, the BMU slot 108 and the ACS slot 110) thus minimizing un-necessary overheads. In one embodiment, the BM register file is connected to only the BMU slot 108 and the ACS slot 110, the De-puncturing Register File is accessible only to the LLD slot 106 and the BMU slot 108.

The specialized register files enable a high throughput decoding functionality and minimize power dissipation since it reduces the number of memory accesses by accessing the intermediate contents locally. The LLD slot 106 may perform at least one of a load-store function, a logical function, a de-puncturing function, and a trace-back function. The BMU slot 108 may perform at least one of a Radix-2 and a Radix-4 branch metric computation, and squared Euclidean branch metric computations required for Trellis and Viterbi decoding. The ACS slot 110 may perform at least one of a Radix-2 and Radix-4 Path metric updates for 2,4,8,16,32 and 64 states.

The operations of the Viterbi CPU 100 are sufficiently pipelined to support high throughput decoding. The stages of the pipelined operation includes generation of a program address, launching the program address, fetching the program and writing into the instruction buffer 104, dispatching and decoding of the instruction (for each execution slot) and fetching the operand from specific register files (e.g., the register file 112). In the next stage, the first cycle is executed and written-back into the register file. The pointer computations are performed in this stage to carry out the memory operations, all the BMU slot 108 operations and de-puncturing operations are completed in this stage.

The second cycle is executed in the next stage and written-back into the register file 112. The data memory address is launched for the memory operations, write data is launched in conjunction with address for the store operations and all the ACS slot 110 operations are multicycle and completed in this stage. The next stage corresponds to the memory wait cycle for the memory read operations and further the next stage corresponds to the stage when the read data is latched at the load store slot interface. The final stage includes latching the data in the load-store slot and writing into the register file 112 for memory read operations. The CPU Control Registers 114 (CCR) may store the demodulation specific control information required for Trellis and Viterbi decoding. The controls specified for Viterbi CPU may include specifying code-rate used during depuncturing and branch metric calculation, specifying indexes for branch metric computation depending on the code rate, parameters for software pipelined loop control and status flags and interrupt control bits.

FIG. 2 illustrates a table 200 showing the number of registers required for read and write ports in the register file 112 of the FIG. 1, according to an embodiment herein. The table shows the number of register file 112 (of read and write ports) as required for enabling the high throughput viterbi decoding. The table 200 includes a DP bank 112A, a BMS and BMP bank 112B, a SMS and SMP bank 112C and a GPR bank 112D.

The DP bank 112A requires two read ports and four write ports for LLD slot 106 and one read port and one write port for BMU slot 108. The BMS and BMP bank 112B requires two read ports and two write ports for BMU slot 108 and four read ports and four write ports for ACS slot 110. The SMS and SMP bank 112C requires two read ports and two write ports for LLD slot 106, two read ports and two write ports for BMU slot 108 and four read ports and four write ports for ACS slot 110. The GPR bank 112D requires four read ports and two write ports for LLD slot 106, one read port and one write port for BMU slot 108 and two write ports for the ACS slot 110.

FIG. 3 illustrates a table 300 showing results for different de-puncturing modes 302 in the de-puncturing function of the LLD slot 106 of FIG. 1, according to an embodiment herein. The table 300 includes the de-puncturing mode field 302 and a result of DEPUN instructions field 304. The LLD slot 106 of the VLIW CPU architecture 100 may perform at least one of a Load-Store function, a logical function, a de-puncturing function and a trace-back function. The LLD slot performs the unique de-puncturing functions which are key from the perspective of Viterbi/Trellis decoding. The de-puncturing functionality may be enabled using DEPUN instructions and used to insert neutral values in punctured positions of ½ rate convolution codes.

The LLD slot 106 may support puncturing code rate of ½, ⅔, ¾, ⅚, and ⅞.In one embodiment, the source symbols are read in an odd even register pair so that the de-puncturing instruction expands the generated symbol pattern as per the required code rate in the depuncturing register bank (DP3, DP2, DP1 and DP0) as shown in the table 300A. The code rate associated with the de-puncturing mode 302 may be specified in one of the control registers (e.g., the CPU control register 106 of FIG. 1), which is subsequently used to ensure that the bit differences from the depuncturing positions are not accounted during the branch metric computations.

Figure 4A:
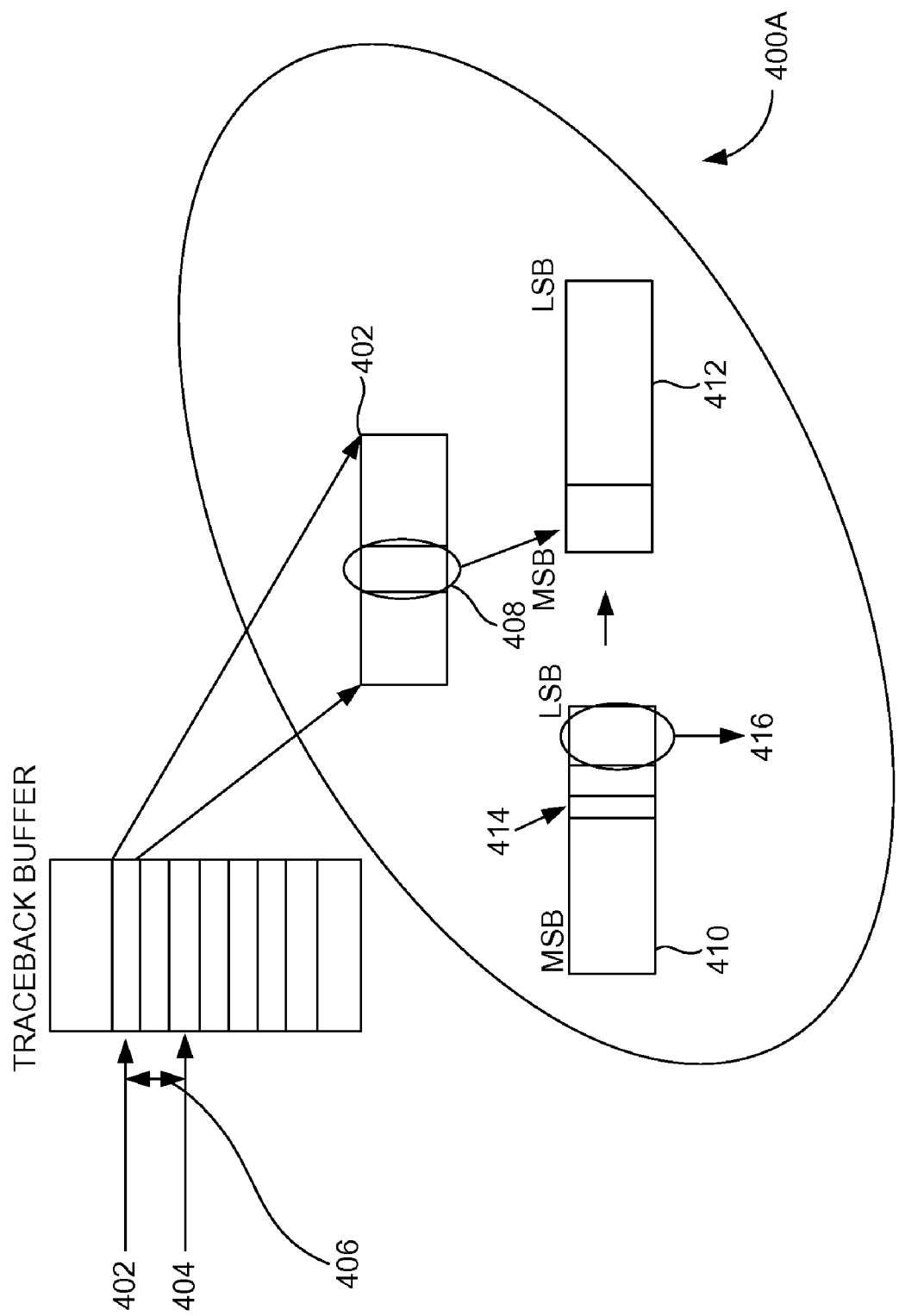
FIG. 4A illustrates an exploded view of Address Computation during Traceback operations on a buffer comprising of Minimum State Metrics for a Forward Trellis operation of the LLD slot of FIG. 1 according to an embodiment herein.

FIG. 4A illustrates an exploded view 400A of Address Computation during Traceback operations on a buffer comprising of Minimum State Metrics for a Forward Trellis operation 400A of the LLD slot 106 of FIG. 1, according to an embodiment herein. The forward Trellis 400A includes an Init Trace back pointer 402, a Next Trace back pointer 404, an offset 406, a decision bit 408, an initial best state index 410, a next best state index 412, a threshold indicator 414 and a decoded bit 416. The Viterbi Trace back addressing mode is a dedicated addressing mode for the trace back operation of state metrics. Before starting the trace back operation, it is assumed that a trace back buffer with decision bits (corresponding to different states) is already available from a previous ACS slot 110 of the loaded channel symbols. The Trace back buffer is filled to an extent as decided by the amount of forward or reverse Trellis iterations to get a reliable decoding.

In the forward Trellis 400A operation, the base pointer Px is loaded with the Init Trace back pointer 402 and the general purpose register Rx is used to obtain the initial best state index 410. The appropriate bit is selected from the best state index based on the threshold indicator bit 414 index stored in CPU control register 106. In one example embodiment, for a polynomial of constraint length 7, the threshold indicator 414 bit is 6th bit for Forward Trellis and 4th bit for Reverse Trellis.

A constant value constant scaling factor (which is dependent upon the type of memory access-word, double-word) of 4 or 8 is multiplied by the value of the best state index (Threshold indicator 414) and added to the base address to get the next Trace back Pointer 404. A post-increment or post-decrement offset 406 indexing feature is additionally provided enabling to move in ascending or descending order in the Trace back buffer 400A. As shown in FIG. 4A the decision vector loaded from memory is used for extracting N decision bits 408 (depending on the corresponding state metric) where N=1 for Radix-2 decoding and N=2 for Radix-4 decoding. In one embodiment, a 2 decision bits are extracted. The N decision bits 408 are appended on the most-significant side of the best state index 410 to derive the next best state index 412 for Traceback in forward Trellis. N bits are shifted out from least-significant side of the best state index 410 for Traceback in forward Trellis. Decoded bits 416 are obtained when the shifted N bits are concatenated.

Similarly, the N decision bits 408 are appended on the most-significant side of the best state index 410 to derive the next best state index 412 for Traceback in reverse Trellis. N bits shifted out from most-significant side of the best state index 410 for Traceback in reverse Trellis. Decoded bits 416 are obtained when the shifted N bits are concatenated.

Figure 4B:
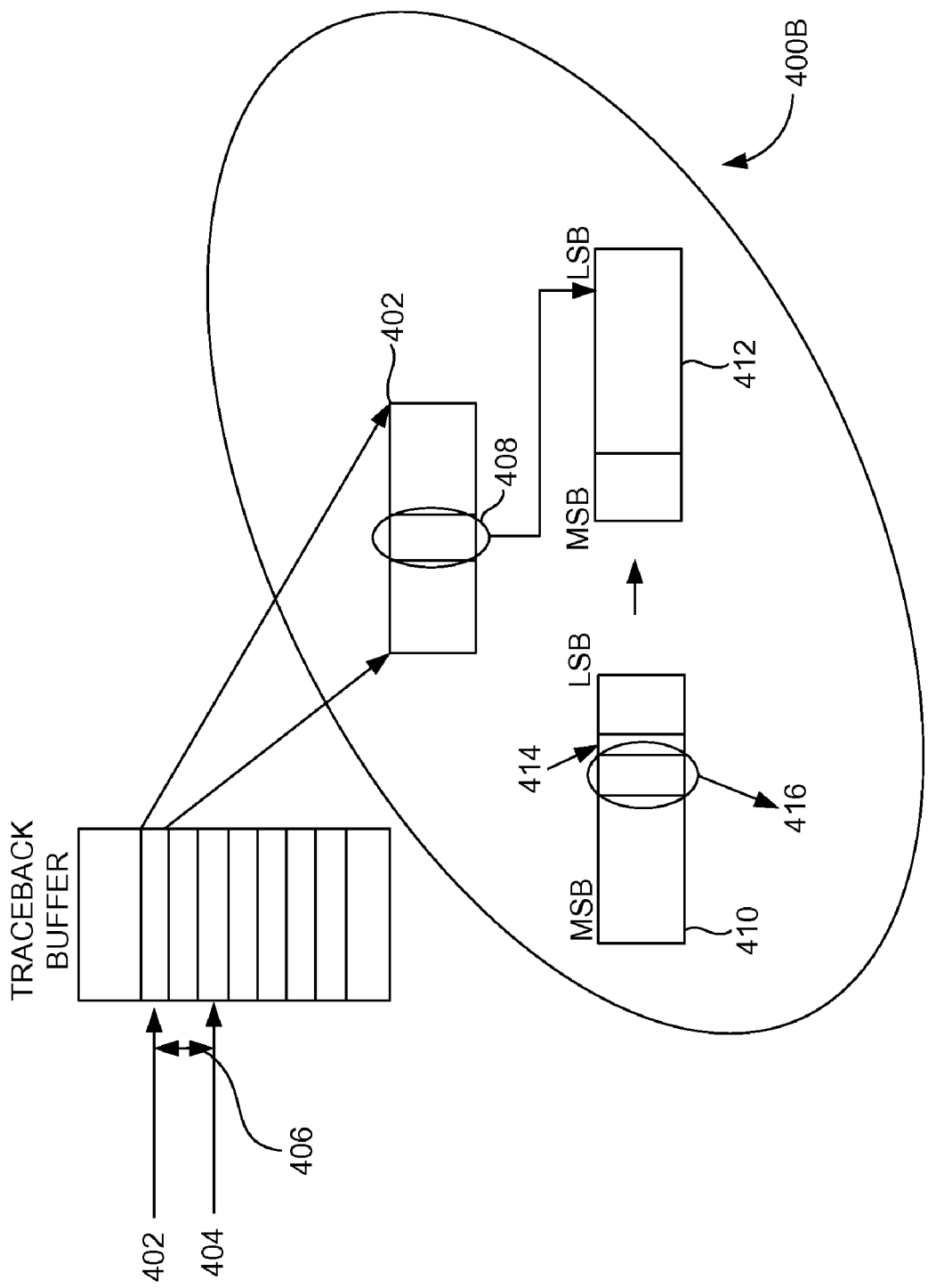
FIG. 4B illustrates an exploded view of Address Computation during Traceback operations on a buffer comprising of Minimum State Metrics for a Reverse Trellis operation of the LLD slot of FIG. 1 according to an embodiment herein.

FIG. 4B illustrates an exploded view 400B of Address Computation during Traceback operations on a buffer including of Minimum State Metrics for a Reverse Trellis operation 400B of the LLD slot 106 of FIG. 1 according to an embodiment herein. The Reverse Trellis 400B performs similar operation as in Forward Trellis. Similarly, the N decision bits 408 are appended on the most-significant side of the best state index 410 to derive the next best state index 412 for Traceback in reverse Trellis. N bits shifted out from most-significant side of the best state index 410 for Traceback in reverse Trellis. Decoded bits 416 are obtained when the shifted N bits are concatenated. The process is repeated continuously till the entire Trace back buffer is traversed and the decoded bits are not extracted.

The ATSC (Trellis) Trace back addressing mode is a dedicated addressing mode for state metrics trace back operation used for ATSC (e.g., where Trellis decoding is used). The ATSC mode uses a register pair Rx, Ry having the best state (e.g., in lower 3 bits say bs[2], bs[1], bs[0]) and decision bits (e.g., in lower 2 bits say db[1],db[0]). The next best state (NBS) is computed as {bs[2]^db[1], bs[0]^db[0], bs[1]} and stored back in Rx. The new decision bit contents are obtained as =((NBS<<1)+16*#offset) which are stored back in Ry. Subsequent extract and shift operations are performed to generate the decoded bits, similar to the previous scheme. The ATSC scheme is used for cases where Trellis decoding is used where some uncoded bits are used along with coded bits.

The LLD slot 106 may be capable of performing 32/64 bit load and store operations. The addressing modes supported in the processor (e.g., of the VLIW CPU architecture 100) are at least one of a linear, a circular and an application specific addressing mode (e.g., called Viterbi addressing mode) used during the trace-back operation. The logical slot (e.g., the LLD slot 106 of FIG. 1) also supports 32 bit logical and shift operations, it supports 32/64 bit field extraction with and without a sign extension.

Figure 5:
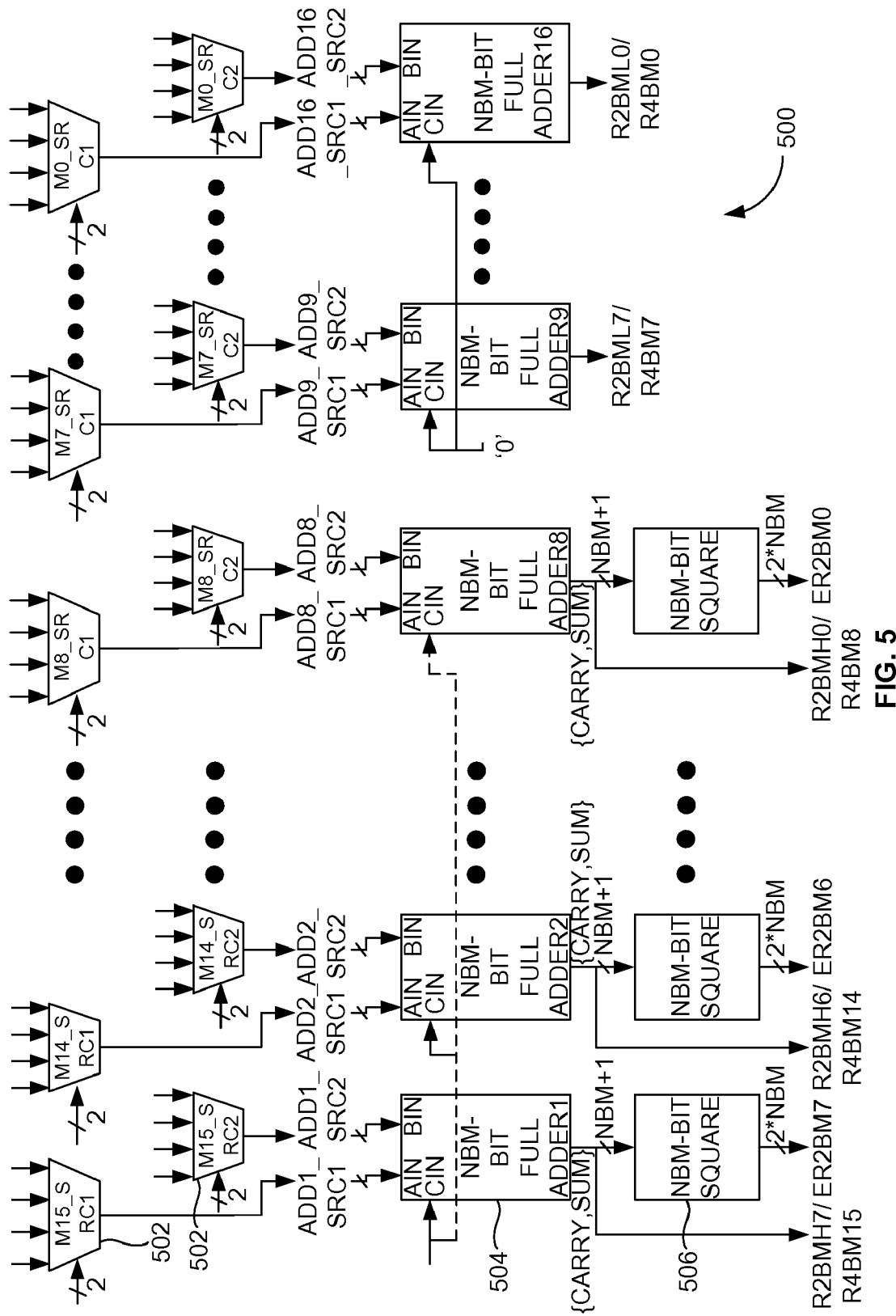
FIG. 5 illustrates an exploded view of the BMU slot of FIG. 1 according to an embodiment herein.

FIG. 5 illustrates an exploded view 500 of the BMU slot 108 of FIG. 1 according to an embodiment herein. The BMU slot 108 includes 32 multiplexers 502, 16 Nbm-bit full adders 504 and 8 Nbm-bit squarer 506. The BMU slot 108 uses 16×Nbm bit adders to compute the branch metric values. The Nbm is the bit width required to perform Radix-4 branch metric computation without loss of result. The number of soft decision bits used to represent a channel symbol for Radix-2 branch metric should not be more than (Nbm-1) wide.

The BMU slot 108 may perform a branch metric computation. In one embodiment, the BMU slot 108 may measure at least one of a Hamming and a Squared Euclidean distance between received symbols and expected symbols. Each received symbol consists of 8 bits with 2 soft decision values of 4 bits each. The distance or the Branch Metric (BM) values are computed in two steps. Radix-2 BM values of two sets of input symbols are computed in a first step and radix-4 BM values in a second step.

The full adders 504 labeled adder9 to adder16 are used to compute 8 Radix-2 branch metric results from a set of 4 input channel symbols. The full adders 504 from Adder1 to Adder16 are used with the result of Radix-2 operation for computing Radix-4 branch metric results. The Squared Euclidean branch metric computation uses the adder1 to adder8 as substractors to compute the difference and the result is passed to the squarer 506 to generate Euclidean branch metrics.

FIG. 6A through 6D illustrate a table for a branch metric input selection for Radix-2, Radix-4 and Squared Euclidean computation according to an embodiment herein. The input multiplexers 502 feeding to the adders 504 are controlled in different modes as shown in the table 600. In a specific case the Nbm is chosen as 5 bit. The different read ports from which the data is made available to the execution slot are opf_read_port0_i and opf_read_ port1_i. For Squared Euclidean branch metric computation (ER2BM instruction) the src2 input of the adders 504 is fed with the reference Trellis symbols.

The various mask values (e.g., DEPUN_MASKLL, DEPUN_MASKLH, DEPUN_MASKHL, and DEPUN_MASKHH) are generated from the BMU slot 108 decoder as a string of Nbm bit wide ZEROS or Nbm bit wide ONES, and propagated to the execution slot to be used for masking the adder 504 sources as necessary before Radix-2 branch metric computation to support depuncturing.

In one embodiment, for adder sources of M0_src1, the corresponding values of R2BML is OPF_READ_PORT0_I (3:0) & DEPUN_MASKLL, R2BMH is OPF_READ_PORT0_I(19:16) & DEPUN_MASKLL (where & means bitwise anding operation), R4BM is OPF_READ_PORT0_I(3:0) and ER2BM #TRELLIS_SYMBOL_INDEX is ZEROS. For adder sources of M0_src2, the corresponding values of R2BML is OPF_READ_PORT0_I(7:4) & DEPUN_MASKLH, R2BMH is OPF_READ_PORT0_I(23:20) & DEPUN_MASKLH, R4BM is OPF_READ_PORT1_I(4:0) and ER2BM #TRELLIS_SYMBOL_INDEX is ZEROS. Similarly, it is understood for adder sources M1_src1, M1_src2, M2_src1, M2_src2, M3_src1, M3_src2, M4_src1, M4_src2, M5_src1, M5_src2, M6_src1, M6_src2, M7_src1, M7_src2, the corresponding values of R2BML, R2BMH, R4BM and ER2BM #TRELLIS_SYMBOL_INDEX are indicated as a continuity in the table 600A and 600B as shown in FIG. 6A and FIG. 6B.

In another embodiment, for adder sources of M8_src1, the corresponding values of R2BML is ZEROS, R2BMH is ZEROS, R4BM is OPF_READ_PORT0_I(20:16) and ER2BM #TRELLIS_SYMBOL_INDEX is {8{OPF_READ_PORT0_I[4K+3:4K]}}, where K ranges from 0 to 7 and is the Trellis symbol index. For adder resources M8_src2, the corresponding values of R2BML is ZEROS, R2BMH is ZEROS, R4BM is OPF_READ_PORT1_I(4:0) and ER2BM #TRELLIS_SYMBOL_INDEX is $1^{st}$ reference symbol of Trellis.

Similarly, it is understood for adder sources M9_src1, M9_src2, M10_src1, M10_src2, M11_src1, M11_src2, M12_src1, M12_src2, M13_src1, M13_src2, M14_src1, M14_src2, M15_src1, M15_src2, the corresponding values of R2BML, R2BMH, R4BM and ER2BM #TRELLIS_SYMBOL_INDEX are indicated in the table 600C and 600D as shown in FIGS. 6C and 6D. The pattern of the depuncturing mask values generated is dependent upon the code rate currently programmed in the CPU control register 106.

Figure 7:
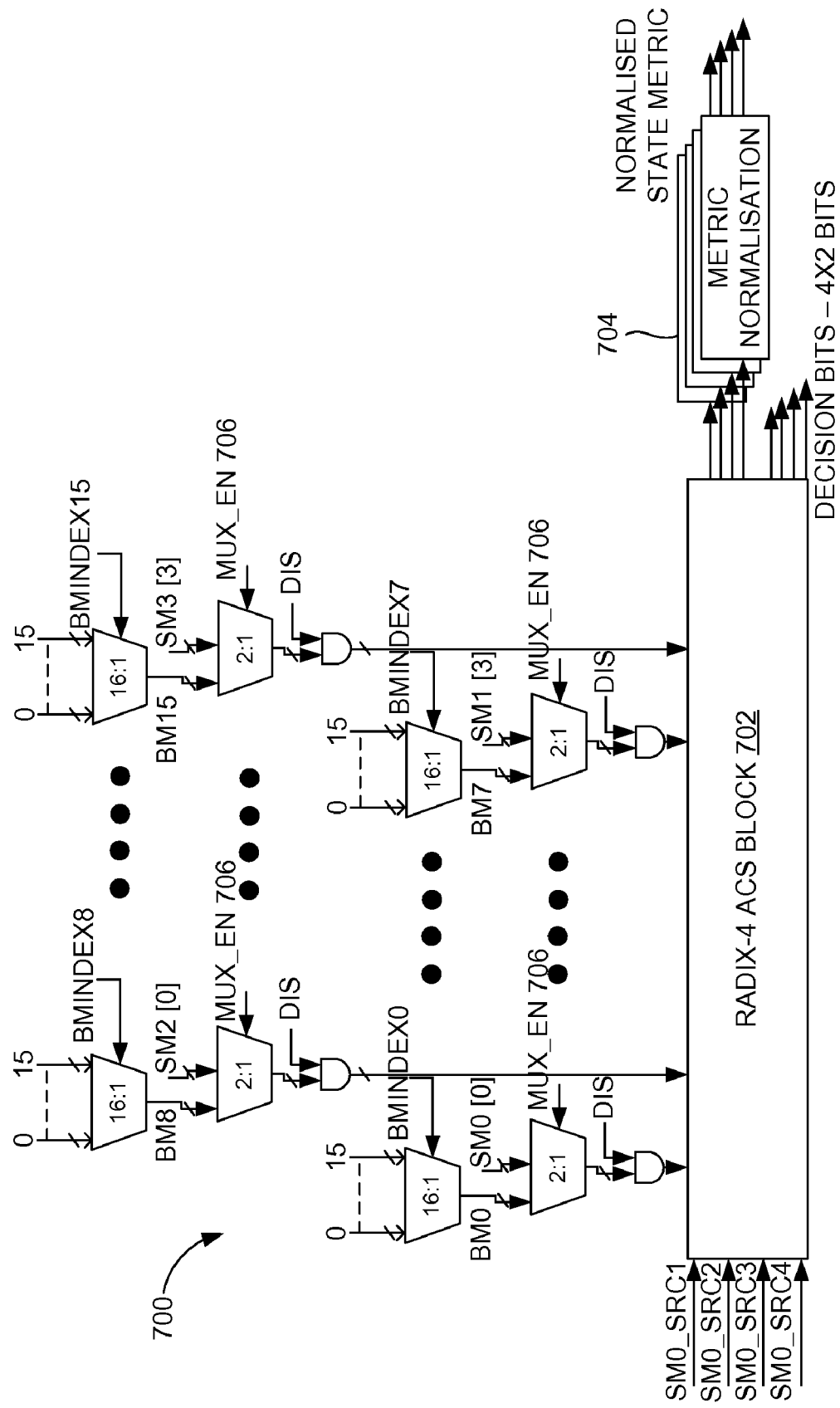
FIG. 7 illustrates an exploded view of the Add-Compare-Select (ACS) slot 110 of FIG. 1 according to an embodiment herein.

FIG. 7 illustrates an exploded view 700 the Add-Compare-Select (ACS) slot 110 of FIG. 1 according to an embodiment herein. The ACS slot 110 of FIG. 1 is used to compute new state metric values of trellis iterations and generation of decision bits. The ACS slot 110 includes configurable Add-Compare-Select Blocks which may perform the functions, viz., Quad Radix-4 ACS computations, dual Radix-4 ACS computations, single Radix-4 ACS computations and best state estimation of lowest 4 state-metrics from set of 16, lowest 2 state-metrics from a set of 8, or lowest state metric from a set of 4. The configurability of the ACS slot 110 enables support of different data rates.

The Radix-4 ACS block 702 has 16 inputs through which the appropriate branch metrics and 4 state metrics values are fed for computation of next state metric 412 and decision bits 416. The four similar blocks are replicated, so that a total of 64 branch metrics are used and 16 state metrics values fed in to generate 64 decision bits 416 and generate 16 new state metrics 412. The state metric register files 208 are used in an interleaved fashion between the primary and secondary banks being used alternatively as source and destination elements. The ACS slot 110 data-path is reused while traversing the forward and reverse Trellis paths.

The MUX_EN signal 706 is active if the current instruction is computing best state metric otherwise selects the arm corresponding to branch metric outputs from the 64 multiplexers. The DIS signal used to gate off the results fed into the Radix-4 702 blocks. When the current instruction is neither an ACS operation nor best state metric computation this signal is disabled to ensure that the second set of inputs fed into the Radix-4 slots are ZEROS. Typically this happens when the data path is used for compare instructions to find minimum 4 states out of 16 or minimum 2 states out of 8 or minimum 1 state out of 4. These operations are typically required when a best state metric has to be computed after the forward and reverse trellis operations are done, before the Trace back phase begins.

The accumulated state metric values are brought within a fixed numerical range for further computational analysis and avoid overflow and underflow situations in the process of path metric computation. This is done using the metric normalization block 704 as shown FIG. 7. The metric normalization block 704 enables Pipelined execution of various operations of the Add-Compare-Select (ACS) slot 110. The State Metrics are addressed differently to support both the Forward and Reverse Trellis paths.

The kind of Trellis transitions is based on whether Radix-2 or Radix-4 type and the Encoder polynomial decide the type of State Transitions. For example, the Convolutional encoder used in DVBT consisting of polynomials G1=[1 7 1] octal and G2=[1 3 3] octal can be characterised by state transitions of the following type when 2 consecutive input bits. If the two consecutive inputs are 00, the previous states [0+j mod 16], [16+j mod 16], [32+j mod 16], [48+j mod 16] are directed to the next state [4j+0].

If the two consecutive inputs are 01, the previous states [0+j mod 16], [16+j mod 16], [32+j mod 16], [48+j mod 16] are directed to the next state [4j+1]. If the two consecutive inputs are 10, the previous states [0+j mod 16], [16+j mod 16], [32+j mod 16], [48+j mod 16] are directed to the next state [4j+2]. If the two consecutive inputs are 11, the previous states [0+j mod 16], [16+j mod 16], [32+j mod 16], [48+j mod 16] are directed to the next state [4j+3]. Here the j value ranges from 0 to 15.

A unique set of 16 possible transmitted channel symbols (including of 2 coded bits per input bit) are identified corresponding to the branch metrics. These transmitted channel symbols are subtracted from received symbols to get the different Branch Metrics. The set of possible channel symbols is the same but generated in a different order. This is used to generate the BM Index tables. These are used to appropriately perform ACS operations based on the present and next state of Trellis iteration.

FIG. 8A illustrates a table 800A for selection of SM sources for the different ACS modes according to an embodiment herein. The 16 state metrics input to the ACS slot 110 are represented as 4 indexes [3:0] for each of the 4 State Metric ports named as SM_port1, SM_port2, SM_port3 and SM_port4 respectively. The appropriate state metrics are fetched from state metric register file 208 in decode phase and routed via the branch metric 206 read ports into the execution slots to compute the best state metrics.

Figure 8B:
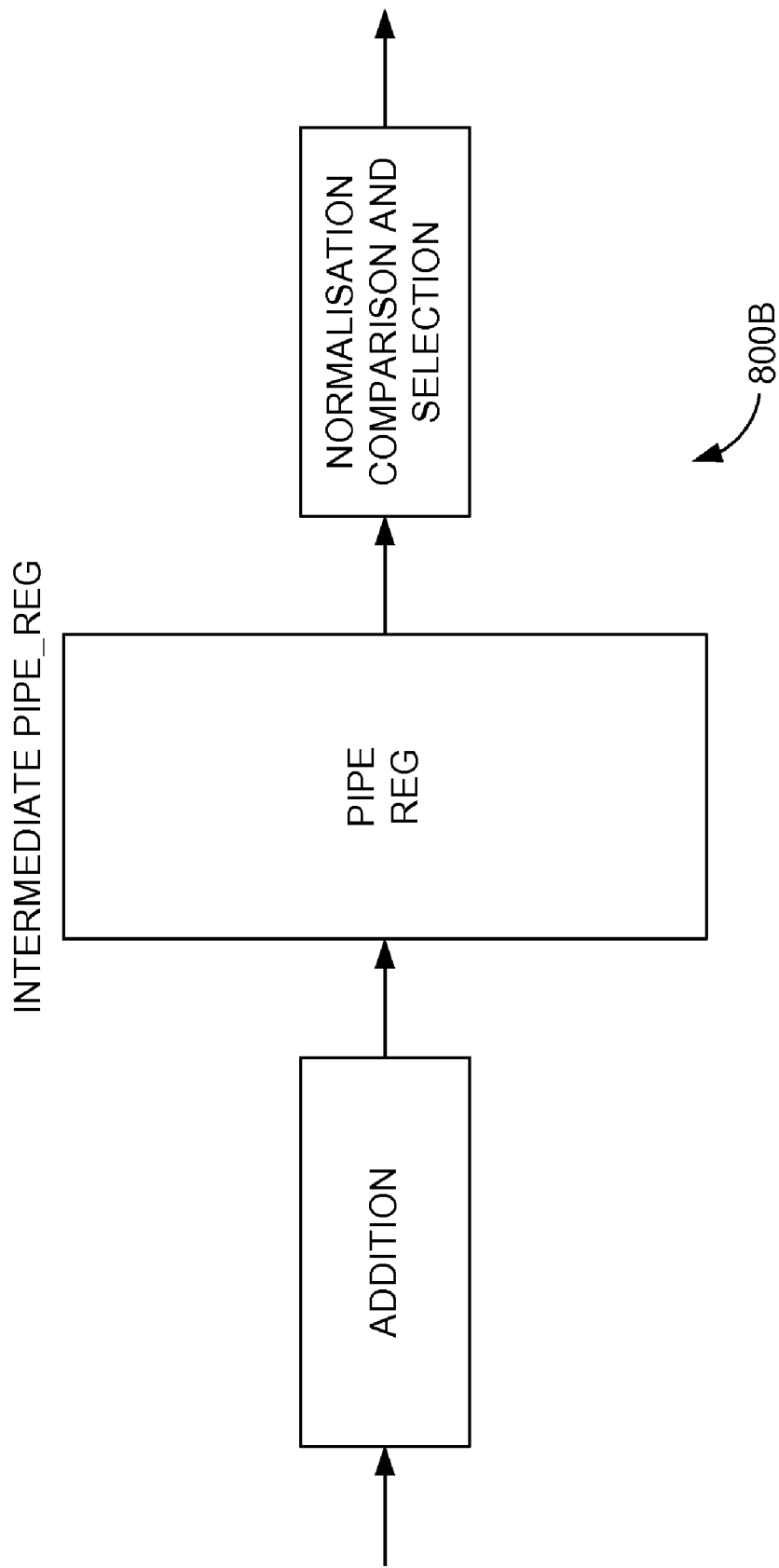
FIG. 8B illustrates the pipelined operation in the ACS execution slot 110 of the FIG. 1 according to the embodiment herein.

FIG. 8B illustrates the pipelined operation 800B in the ACS execution slot 110 of the FIG. 1 according to the embodiment herein. The ACS slot 110 is reused for the computation of the best state after the trace back and traces forward operation. Two sets of state metric values (forward and reverse) are used instead of BM values. The result of this computation is the set of 16 state metric values from which the minimum has to be found. The ACS slot 110 is reused with one of the input being zero and ¼ of the ACS block is used to get 4 state metric values and the corresponding states are given out. The ACS slot 110 is further used to extract best state out of 4 minimum states. Operations in the ACS execution slots 110 always take 2 cycles to complete since the processes of addition and subsequent normalization, comparison and selection are pipelined.

Figure 9A:
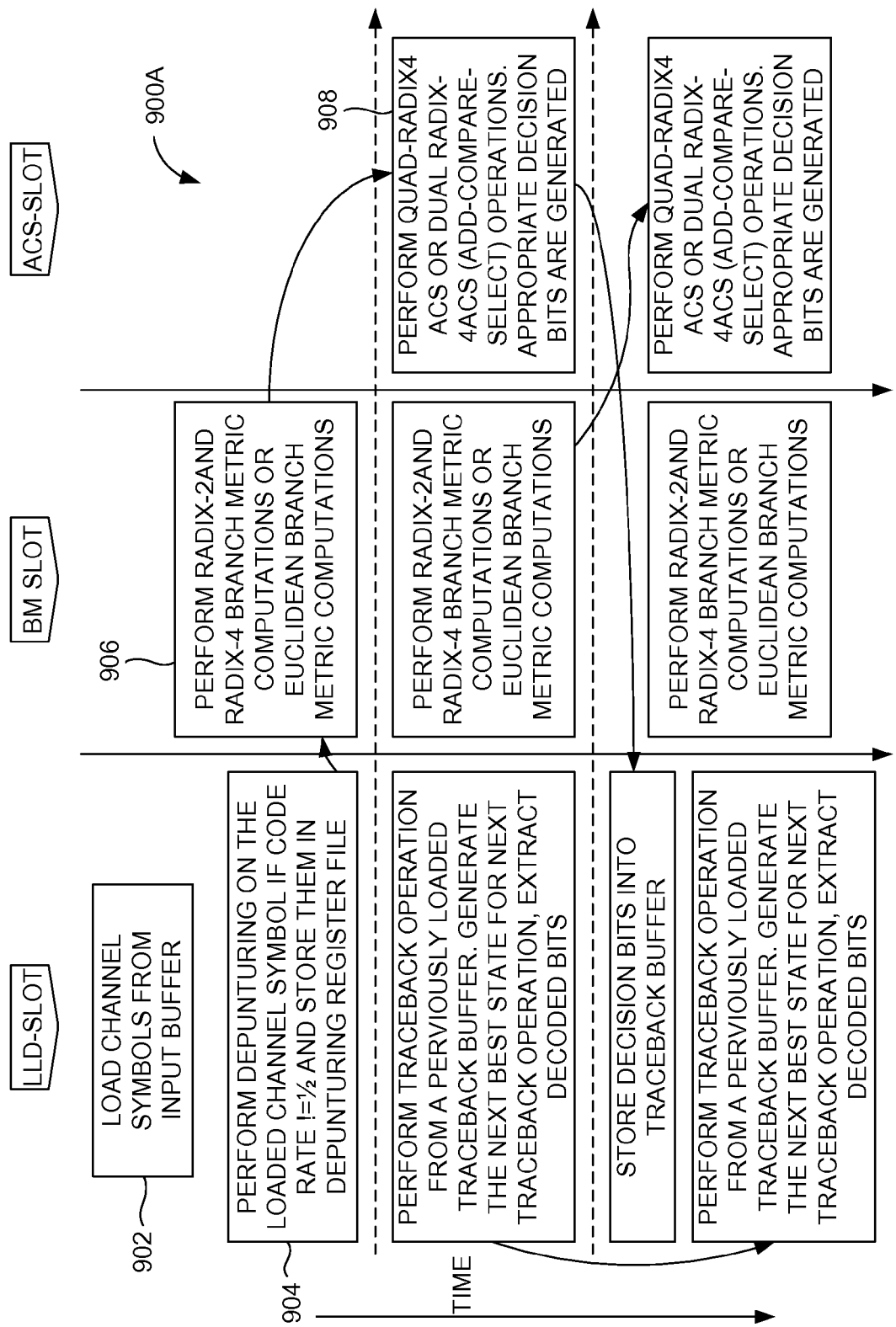
FIGS. 9A and 9B illustrates the execution of viterbi decoding process on the Viterbi CPU of FIG. 1 according to the embodiment herein.
Figure 9B:
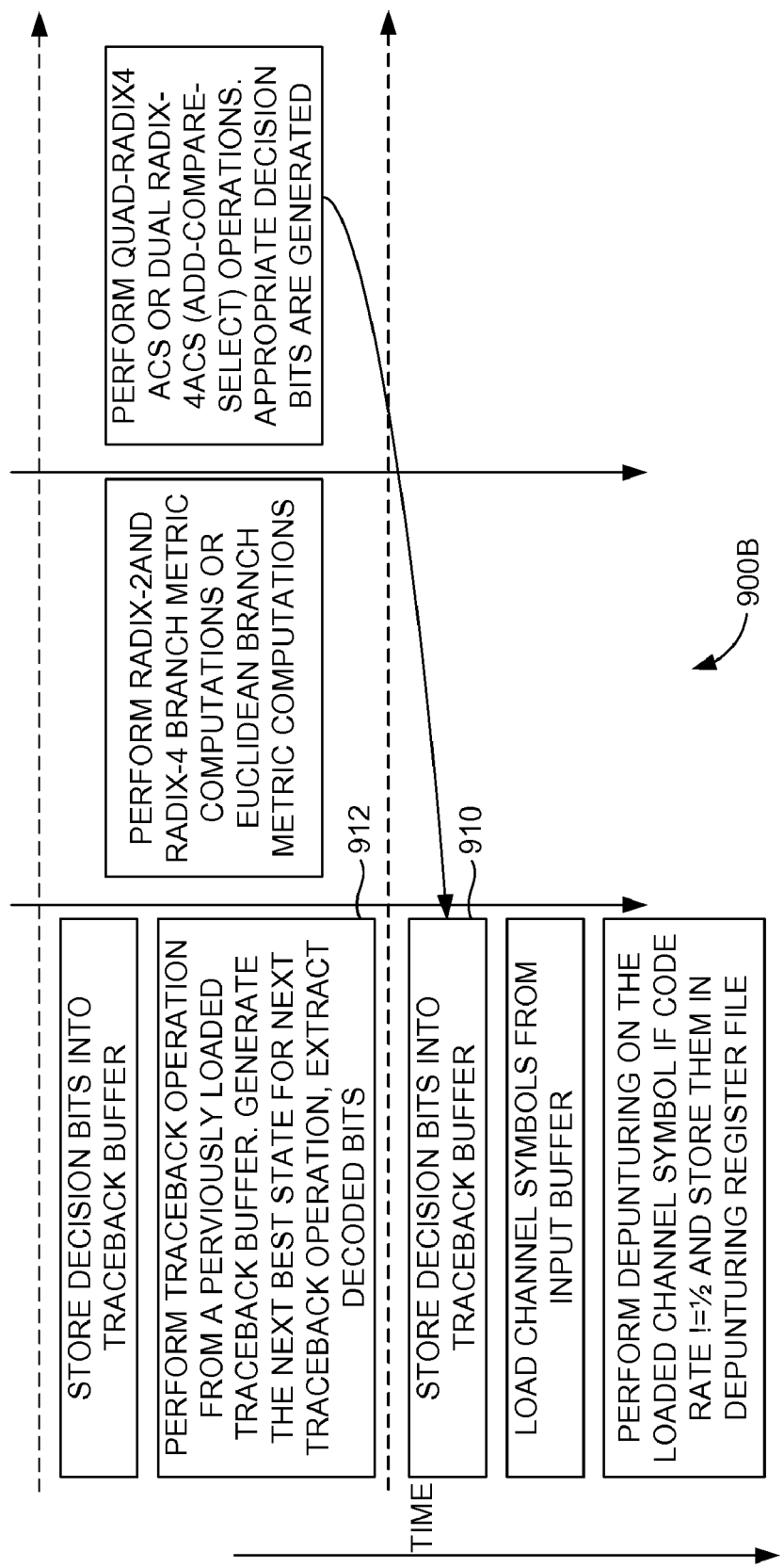

FIGS. 9A and 9B illustrate the execution of Viterbi decoding process on the Viterbi CPU 100 of FIG. 1 according to the embodiment herein. In step 902, the channel symbols are loaded from the input buffer. In the step 904, depuncturing is performed on the loaded channel symbol if the code rate is ½ and stored in the de-puncturing register file. In the step 906, branch metrics are found using Radix-2 and Radix-4 computation or Euclidean branch metric computation. In the step 908, next state metrics and decision bits for each Trellis iteration is computed using Quad-Radix ACS or Dual Radix ACS. In the step 910, the decision bits are stored in Trace back buffer. In the step 912, trace back operation is performed on the previously loaded trace back buffer and the next best state is generated for the next trace back operation and the decoded bits are extracted.

High throughput Viterbi/Trellis Decoding can be achieved by pipelining the operations carried out in the steps 902 to 912. The VLIW architecture of the Viterbi CPU 100 enables pipelined operation of the steps 902 to 912 as shown in FIG. 9 by splitting the tasks in different execution slots. As shown in the FIG. 9 the Channel symbols are loaded in the LLD slot 106 and subsequently de-punctured to prepare for Branch Metric Operations. The Branch Metric operations are subsequently carried out on a small slice of loaded channel symbols in the BM execution slot for both Radix-2 and Radix-4 branch metric operations. Thus 16 Branch metric values are generated. In subsequent cycles, the ACS slot 110 uses the 16 Branch Metric values to perform Quad-ACS operations till all the states are covered for single trellis iteration. The appropriate Decision bits are stored in a general purpose register and Next State Metrics are updated to prepare for the next trellis operation. The Decision bits are stored in the Trace back buffer for future Decoding process using the LLD-slot 106. While all the abovementioned process is ongoing the Load Store Slot also processes the previously stored decision bits in the Trace back buffer to perform Trace back starting from the Best State.

As more slices of input channel symbols get decoded and get stored in the new Trace back buffer more decoded bits are generated by performing Trace back operations on a previous buffer. In this manner a pipelined mechanism is created where current channel symbols are used to generated new Trace back buffer. Simultaneously previous Trace back buffers are used to decode bits and complete the decoding process by accumulating bits over several Trace back operations. Once all the data from the loaded channel symbols get completely used, new input channel symbols are loaded from memory to rerun all the operations (e.g., the steps 902 to 912) in a loop. The Best State Metric is computed using the ACS slot 110 and fed to the LLD slot 106 which perform Trace back, which enables doing a block based Viterbi decoding using this CPU.

The embodiments herein provides a VLIW architecture optimized for High Speed Viterbi (or Trellis Coded Modulation) decoding and capable of supporting Block based Viterbi decoding. The architecture has the most optimum partitioning of execution slots (e.g., the LLD slot 106, the BMU slot 108 and the ACS slot 110 of FIG. 1) to keep the utilization of each of the different functions (e.g., Metric Computation, Add-Compare-Select and Trace-back functionality) balanced. Defining several instructions in the three execution slots and when these functions are performed in a Software Pipelined manner enables a high speed Viterbi decoding. The architecture enables variable trace-back depth which can be controlled depending upon the channel noise conditions and helps in optimizing the memory required for trace back.

For example, the ACS slot 110 includes Radix-4 instructions and Best State Metric finding instructions. The BMU slot 108 includes instructions to perform Radix-2, Radix-4 and Squared Euclidean distance computations. The LLD slot 106 includes instructions to support De-puncturing and High-Speed Trace-back operations. The De-puncturing support without increasing the external memory requirements. A Special Load-Traceback operation embedded in the Load-Store Slot enables a high speed decoding. The VLIW architecture is scalable where multiple execution slots can be used to address higher decoding rates.

This scalability can be offered by increasing the number of register in State-Metric and Branch-Metric register banks, increasing the number of SIMD ways in ACS and BM slots and having multiple Load-Store slots to support faster Trace-back and channel symbol loading.

The flexibility of the ACS slot 110 supports convolution encoders with number of states ranging from 2 to 64 that supports forward and reverse Trellis operations to enable block based decoding, enables pipelined execution with embedded metric normalization step. The embodiments provide an optimized register file with separate bank based operations for State Metrics, Branch Metrics and Depuncturing operations.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of performing a high speed Viterbi and Trellis Coded Modulated (TCM) decoding for a Multi-Standard support in an application specific processor, said application specific processor comprising:
   a Load-Store, Logical and De-puncturing (LLD) slot that performs at least one of a Load-Store function, a Logical function, a De-puncturing function, and a Traceback Address generation function to generate decode bits;
   a Branch Metric Compute (BMU) slot that performs at least one of Radix-2 branch metric computations, Radix-4 branch metric computations, and Squared Euclidean Branch Metric computations;
   an Add-Compare-Select (ACS) slot that performs at least one of Radix-2 Path metric computations, Radix-4 Path metric computations, best state computations, and a decision bit generation; and
   specialized register file components, said specialized register file components comprising an optimized number of at least one of read ports and write ports that enables a faster processing of said Viterbi decoding functions, wherein said specialized register file components comprising at least one of a De-puncturing Register File, a General Purpose Register file, Primary and Secondary State Metric Register files, and Primary and Secondary Branch Metric Register files, wherein said method comprising:
      loading channel symbols in an input buffer based on instructions received as a fetch packet;
      de-puncturing said channel symbols based on a puncturing code rate, said puncturing code rate is at least one of a ½, ⅔, ¾, ⅚, and ⅞ rates convolution codes;
      storing de-punctured channel symbols in said De-puncturing Register File; and
      extracting bits from said De-puncturing Register File to said General Purpose Register File.

2. The method of claim 1, further comprising computing at least one of Radix-2 branch metric values, Radix-4 branch metric values, and Squared Euclidean branch metric values for said de-punctured channel symbols in said BMU slot.

3. The method of claim 1, further comprising computing at least one of Quad Radix-4 and Dual Radix-4 add-compare-select values in said ACS slot, wherein said ACS slot is a 4 way Single Instruction Multiple Data (SIMD) slot.

4. The method of claim 3, further comprising generating decision bits based on said add-compare-select values and storing said decision bits in a trace back buffer.

5. The method of claim 1, wherein said de-puncturing said channel symbols is enabled using DEPUN instructions.

6. A method of generating a trackback address of high speed Viterbi and Trellis Coded Modulated (TCM) decoding for a Multi-Standard support in a Traceback buffer, said method being implemented in an application specific processor, said application specific processor comprising:
   a Load-Store, Logical and De-puncturing (LLD) slot to perform at least one of a Load-Store function, a Logical function, a De-puncturing function, and a Traceback Address generation function;
   a Branch Metric Compute (BMU) slot that performs at least one of Radix-2 branch metric computations, Radix-4 branch metric computations, and Squared Euclidean Branch Metric computations; and
   an Add-Compare-Select (ACS) slot that performs at least one of Radix-2 Path metric computations, Radix-4 Path metric computations, best state computations, and a decision bit generation, wherein said method comprising:
      loading a base pointer with an InitTraceback pointer;
      obtaining a best state index based on said best state metric computations from said ACS slot using a general purpose register;
      selecting an appropriate bit from said best state index based on a threshold indicator bit index, wherein said threshold indicator bit index is stored in a CPU control register (CCR);
      obtaining a next InitTraceback pointer, wherein said next InitTraceback pointer is obtained by multiplying a constant value constant scaling factor to a value of said appropriate bit being indexed from said best state index using said threshold indicator bit index and adding a base address;
      performing at least one of a post-increment offset indexing or a post-decrement offset indexing in said Traceback buffer;
      extracting N decision bits based on a state metric computation, wherein said N bits are extracted using a decision vector loaded from a location by said InitTraceback pointer;
      appending said N decision bits to derive a Next Best State Index, wherein said N decision bits are appended on a most significant side of said best state index to derive said Next Best State Index for a Traceback in forward Trellis;
      wherein said N decision bits are appended on a least significant side of said best state index to derive said Next Best State Index for a Traceback in reverse Trellis;
      shifting N bits of said Best State Index, wherein said N bits are shifted from a least significant side of said Best State Index for said Traceback in forward Trellis;
      wherein said N bits are shifted from a most significant side of said Best State Index for said Traceback in reverse Trellis; and
      obtaining decoded bits by concatenating said N bits being shifted.

7. The method of claim 6, further comprising:
   loading a base pointer with said next InitTraceback pointer being obtained;
   obtaining a best state index based on a result from said next best state index;
   wherein if said Traceback buffer is not fully traversed and said decoded bits are not extracted, said method further comprising:
      selecting an appropriate bit from said best state index based on a threshold indicator bit index;
      obtaining a next InitTraceback pointer, wherein said next InitTraceback pointer is obtained by multiplying a constant value constant scaling factor to a value of said appropriate bit being indexed from said best state index using said threshold indicator bit index and adding a base address;

performing at least one of a post-increment offset indexing or a post-decrement offset indexing in said Traceback buffer;

extracting N decision bits based on a state metric computation, wherein said N decision bits are extracted using a decision vector loaded from a location by said InitTraceback pointer;

appending said N decision bits to derive a Next Best State Index, wherein said N decision bits are appended on a most significant side of said best state index to derive said Next Best State Index for said Traceback in forward Trellis;

wherein said N decision bits are appended on a least significant side of said best state index to derive said Next Best State Index for said Traceback in reverse Trellis; and shifting N bits of said Best State Index, wherein said N bits are shifted from a least significant side of said Best State Index for said Traceback in forward Trellis;

wherein said N bits are shifted from a most significant side of said Best State Index for said Traceback in reverse Trellis; and obtaining decoded bits by concatenating said shifted N bits being shifted.

* * * * *